(12) United States Patent
Kim

(10) Patent No.: US 12,256,501 B2
(45) Date of Patent: Mar. 18, 2025

(54) PRINTED CIRCUIT BOARD

(71) Applicant: SAMSUNG ELECTRO-MECHANICS CO., LTD., Suwon-si (KR)

(72) Inventor: In Gun Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 210 days.

(21) Appl. No.: 18/134,697

(22) Filed: Apr. 14, 2023

(65) Prior Publication Data
US 2024/0147634 A1 May 2, 2024

(30) Foreign Application Priority Data
Oct. 27, 2022 (KR) .................. 10-2022-0140031

(51) Int. Cl.
*H05K 3/46* (2006.01)
*H05K 1/11* (2006.01)
*H05K 1/14* (2006.01)

(52) U.S. Cl.
CPC ............ *H05K 3/465* (2013.01); *H05K 1/115* (2013.01); *H05K 1/145* (2013.01); *H05K 3/4682* (2013.01); *H05K 2201/096* (2013.01); *H05K 2203/1536* (2013.01)

(58) Field of Classification Search
CPC .. H05K 3/465; H05K 1/115; H05K 2201/096; H05K 2201/09563; H05K 1/11; H05K 3/4661
See application file for complete search history.

(56) References Cited

U.S. PATENT DOCUMENTS

| | | | | |
|---|---|---|---|---|
| 8,373,071 B2* | 2/2013 | Yu | ........................ | H05K 3/107 174/262 |
| 8,450,623 B2* | 5/2013 | Tseng | ..................... | H05K 3/465 174/265 |
| 2009/0242261 A1 | 10/2009 | Takenaka et al. | | |
| 2020/0043841 A1* | 2/2020 | Arai | .................. | H01L 23/49838 |
| 2021/0036416 A1* | 2/2021 | Yang | ........................ | H01Q 1/36 |

FOREIGN PATENT DOCUMENTS

| | | |
|---|---|---|
| JP | 2021-150306 A | 9/2021 |
| KR | 10-2010-0090806 A | 8/2010 |
| KR | 10-2017-0028710 A | 3/2017 |

* cited by examiner

*Primary Examiner* — Sherman Ng
(74) *Attorney, Agent, or Firm* — MORGAN, LEWIS & BOCKIUS LLP

(57) ABSTRACT

The present disclosure relates to a printed circuit board including a first insulating layer including a non-photosensitive insulating material, a first wiring layer embedded in the first insulating layer, where an upper surface thereof is exposed from the upper surface of the first insulating layer, includes a first metal layer, and a second metal layer covering at least a portion of each of the lower surface and side surface of the first metal layer with a thickness thinner than the first metal layer, and a second insulating layer disposed under the lower surface of the first insulating layer to cover at least a portion of a lower surface of the first wiring layer, and including the non-photosensitive insulating material.

12 Claims, 13 Drawing Sheets

PRINTED CIRCUIT BOARD

CROSS-REFERENCE TO RELATED APPLICATION(S)

This application claims benefit of priority to Korean Patent Application No. 10-2022-0140031 filed on Oct. 27, 2022, in the Korean Intellectual Property Office, the disclosure of which is incorporated herein by reference in its entirety.

TECHNICAL FIELD

Example embodiments of the present disclosure relate to a printed circuit board.

BACKGROUND

Generally, a modified semi-additive process (MSAP) is used as a plating process for forming a circuit pattern on an insulating material. The MSAP forms a circuit by applying chemical copper to the insulating material as a seed and then plating electrolytic copper using a dry film. Therefore, after forming the circuit, a wet etching process is required to remove the chemical copper seed from the lower part of the dry film. However, an undercut may occur during such wet etching, and a circuit line width may decrease. Also, when the circuit line width decreases, delamination between the circuit and the insulating material may occur, and as a result, the reliability of the product may also be affected.

SUMMARY

An aspect of the present disclosure is to provide a printed circuit board capable of effectively suppressing the undercut and/or delamination described above.

One of several objects of the present disclosure is to delete the undercut generation mechanism by first forming a non-photosensitive insulating layer before plating to form a wiring layer. For example, the dry film is formed on the lower insulating layer, then patterned, an upper insulating layer covering the lower insulating layer is formed, the dry film may be removed, and the patterned opening formed by removing the dry film may be plated to form the wiring layer.

Accordingly, the printed circuit board according to an embodiment may comprise a first insulating layer including the non-photosensitive insulating material; a first wiring layer embedded in the first insulating layer, where an upper surface thereof is exposed from an upper surface of the first insulating layer, and which includes a first metal layer and a second metal layer covering at least a portion of each of lower surface and side surface of the first metal layer with a thickness thinner than the first metal layer; and a second insulating layer disposed on the lower surface of the first insulating layer to cover at least a portion of the lower surface of the first wiring layer, and including the non-photosensitive insulating material.

In addition, the printed circuit board according to an embodiment may comprise an insulating layer including the non-photosensitive insulating material; and a first wiring layer embedded on an upper side of the insulating layer, where an upper surface thereof is exposed from the upper surface of the insulating layer, and which includes a first metal layer and a second metal layer covering at least a portion of each of lower surface and side surface of the first metal layer with a thickness thinner than the first metal layer, wherein the first wiring layer has a substantially vertical side surface.

An aspect of the various effects of the present disclosure is to provide a printed circuit board capable of effectively suppressing the undercut and/or delamination described above.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Electronics

Figure 1:
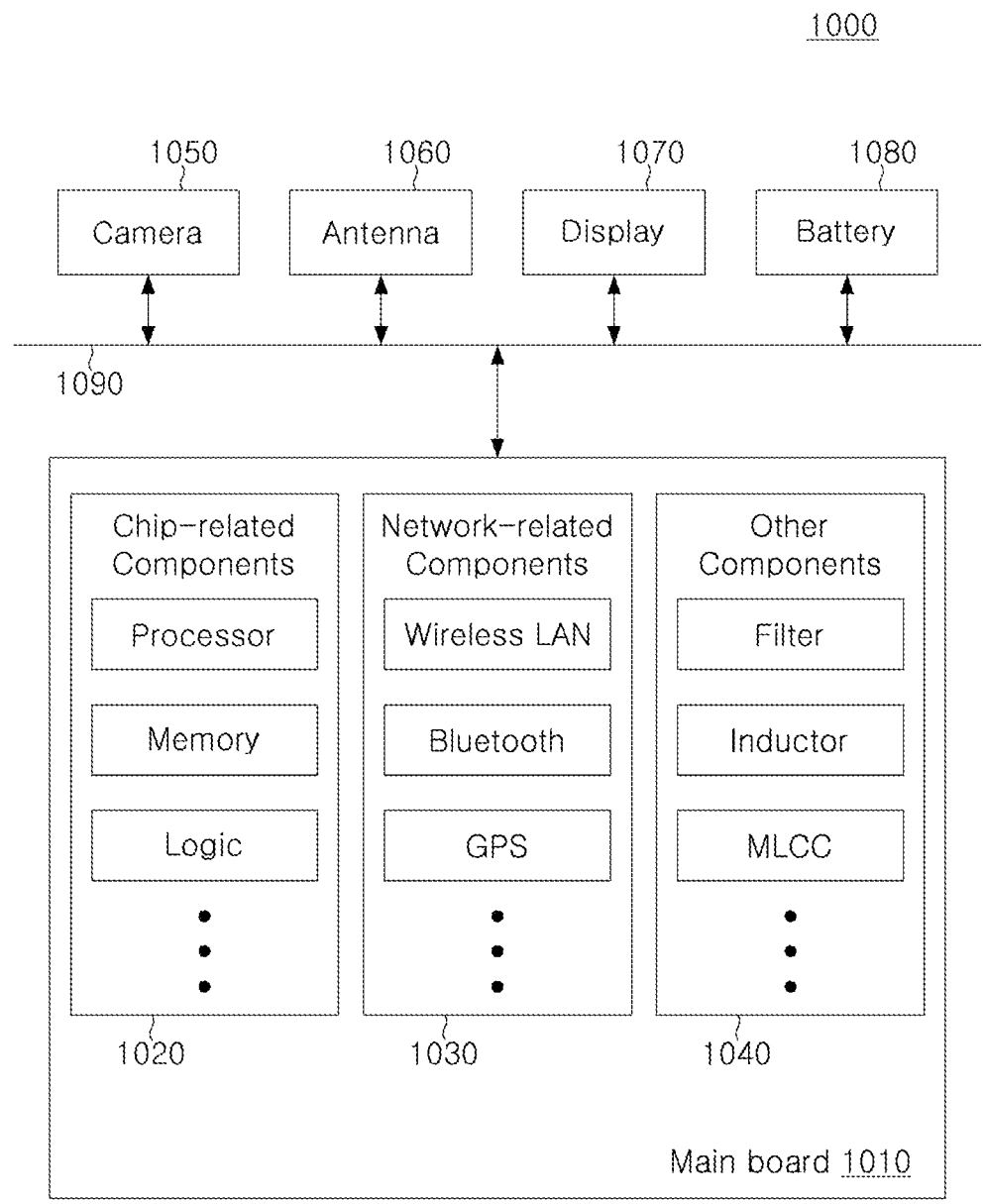
FIG. 1 is a block view schematically illustrating an embodiment of an electronic device system.

FIG. 1 is a block diagram schematically illustrating an embodiment of an electronic device system.

Referring to the figure, an electronic device 1000 accommodates a mainboard 1010. Chip-related components 1020, network-related components 1030, and other components 1040 are physically and/or electrically connected to the mainboard 1010. These are also combined with other electronic components described below to form various signal lines 1090.

The chip-related components 1020 include memory chips such as volatile memory (e.g., DRAM), non-volatile memory (e.g., ROM), and flash memory, etc.; application processor chips such as central processors (e.g., CPUs), graphics processors (e.g., GPUs), digital signal processors, cryptographic processors, microprocessors, microcontrollers, etc.; logic chips such as analog-to-digital converters and ASIC (application-specific IC), etc., and the present disclosure is not limited thereto, and other chip-related electronic components may also be included. Also, these chip-related components 1020 can be also combined with each other. The chip-related components (1020) may be in the form of a package containing the chip or electronic component described above.

The network-related components 1030 include Wi-Fi (IEEE 802.11 family, etc.), WiMAX (IEEE 802.16 family, etc.), IEEE 802.20, LTE (long term evolution), EV-DO, HSPA+, HSDPA+, HSUPA+, EDGE, GSM, GPS, GPRS, CDMA, DECT, Bluetooth, 3G, 4G, 5G, and any other wireless and wired protocols designated as subsequent are included, and the present disclosure is not limited thereto, and any of a number of other wireless or wired standards or protocols may also be included. Also, the network-related components 1030 can be also combined with the chip-related component 1020.

Other components 1040 include high frequency inductors, ferrite inductors, power inductors, ferrite beads, Low Temperature Co-Firing Ceramics (LTCC), an electromagnetic interference (EMI) filter, and a multi-layer ceramic condenser (MLCC). However, the present disclosure is not limited thereto, and can also include passive disclosure in the form of chip components used for various other purposes. Also, other components 1040 may be combined with the chip-related components 1020 and/or the network-related components 1030.

Depending on the type of electronic device 1000, the electronic device 1000 may include other electronic components that may or may not be physically and/or electrically connected to the mainboard 1010. Embodiments of other electronic components include a camera module 1050, an antenna module 1060, a display 1070, and a battery 1080. However, the present disclosure is not limited thereto, and may be audio codecs, video codecs, power amplifiers, compasses, accelerometers, gyroscopes, speakers, mass storage devices (for example, hard disk drives), compact disks (CD), digital compact disks (DVDs), etc. It is natural that other electronic components used for various purposes may also be included depending on the type of electronic device 1000.

The electronic device 1000 may be a smart phone, a personal digital assistant, a digital video camera, a digital still camera, a network system, a computer, a monitor, a tablet, a laptop, a netbook, a television, a video game, a smart watch, and an automotive, etc. However, the present disclosure is not limited to these, and may be any other electronic device that processes data.

Figure 2:
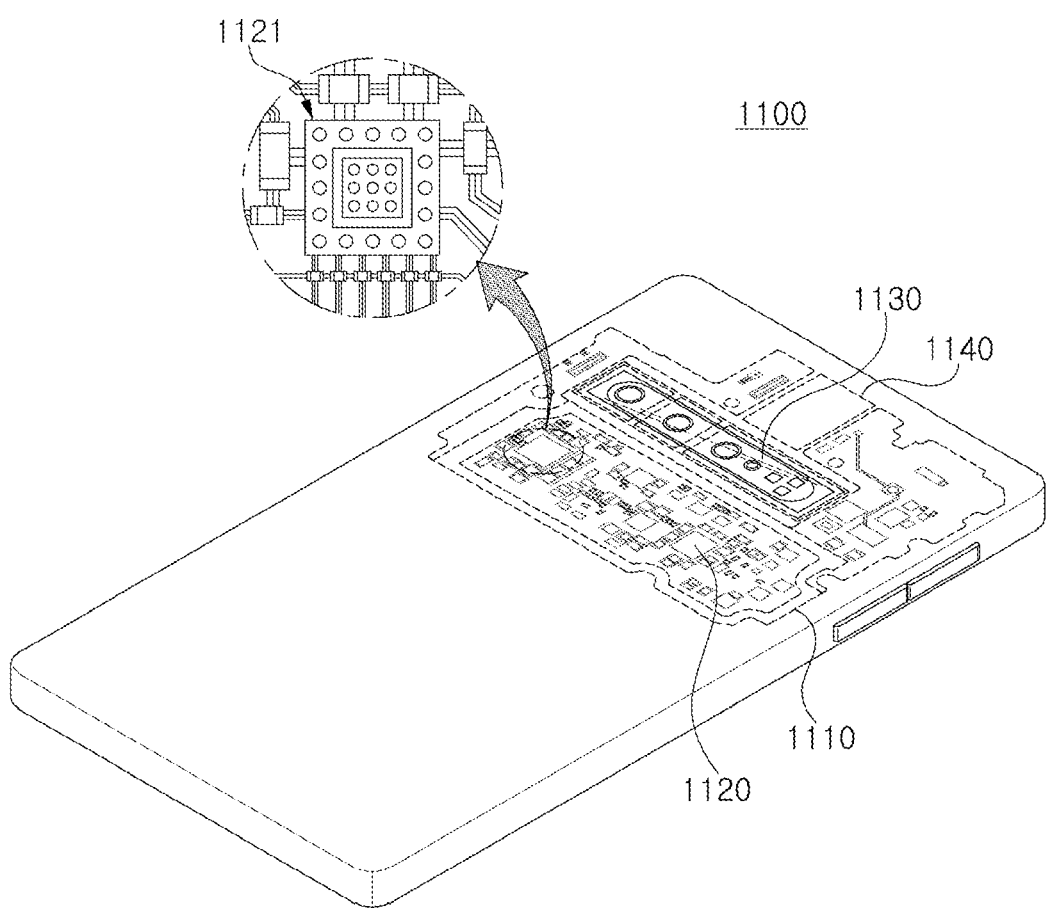
FIG. 2 shows a perspective view schematically illustrating an embodiment of an electronic device.

FIG. 2 is a perspective view schematically illustrating an embodiment of the electronic device.

Referring to the figure, the electronic device may be, for example, a smartphone 1100. A motherboard 1110 is received inside the smartphone 1100, and various components 1120 are physically and/or electrically connected to this motherboard 1110. Also, other components that may or may not be physically and/or electrically connected to the motherboard 1110, such as camera module 1130 and/or speaker 1140, are received inside. Some of the components 120 may be the chip-related components as described above, for example, they may be component package 1121, but the present disclosure is not limited thereto. The component package 1121 may be in the form of a printed circuit board with electronic components including active components and/or passive components disposed as surface mounts. Furthermore, the component package 1121 may be in the form of a printed circuit board in which an active component and/or a passive component are embedded. Meanwhile, the electronic device is not necessarily limited to the smartphone 1100, and may be another electronic device as described above.

Printed Circuit Board

Figure 3:
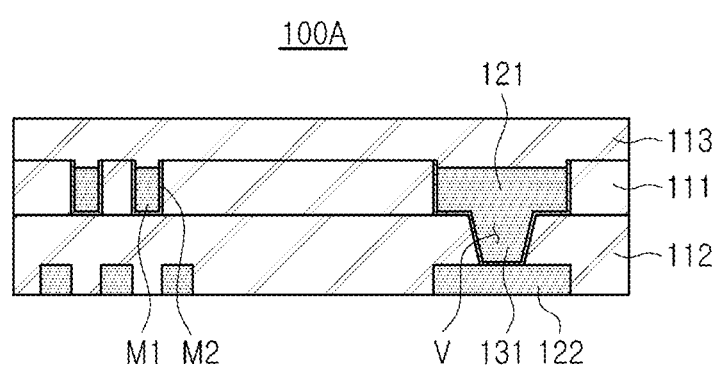
FIG. 3 is a cross-sectional view schematically illustrating an embodiment of a printed circuit board.

FIG. 3 is a cross-sectional view schematically illustrating an embodiment of a printed circuit board.

Referring to the figure, the printed circuit board 100A according to an embodiment is a first insulating layer 111, a first wiring layer 121 embedded in the first insulating layer 111, where the upper surface thereof is exposed from the upper surface of the first insulating layer 111, a second insulating layer 112 disposed on the lower surface of the first insulating layer 111 to cover at least a portion of the lower surface of the first wiring layer 121, a second wiring layer 122 embedded in the lower side of the second insulating layer 112, a via 131 disposed in a via hole (V) penetrating the second insulating layer 112 to electrically connect the first and second wiring layers 121 and 122, and a third insulating layer 113 disposed on the upper surface of the first insulating layer 111 to cover at least a portion of the exposed upper surface of the first wiring layer 121.

The first wiring layer 121 may include the first metal layer M1 and the second metal layer M2 covering at least a portion of each of the lower surface and side surfaces of the first metal layer M1 with a thinner thickness than the first metal layer M1. The second metal layer M2 may be a seed layer for the formation of the first metal layer M1. The via 131 may include a wall surface of the via hole V, a second metal layer M2 extending onto an upper surface exposed through the via hole V of the second wiring layer 122, and a first metal layer M1 extending into the via hole V. As can be seen from the process described later, this arrangement of the second metal layer M2 may omit the flash etching process to remove the seed layer, thereby effectively suppressing undercutting in the first wiring layer 121 and reducing the line width of the first wiring layer 121.

The first insulating layer 111, the second insulating layer 112, and/or the third insulating layer 113 may include the non-photosensitive insulating material, respectively. For example, an ABF (Ajinomoto Build-up Film) may be included. In particular, when the first insulating layer 111 includes the non-photosensitive insulating material, as may be seen in the process described later, a patterned opening for forming the first wiring layer 121 may be formed using a patterned dry film, thereby forming the first wiring layer 121 by plating after forming the first insulating layer 111, and the mechanism for undercutting the first wiring layer 121 may be removed from the beginning. Also, when the second insulating layer 112 includes the non-photosensitive insulating material and the via hole V is formed by laser processing, etc., a part of the upper surface of the second wiring layer 122 exposed through the via hole V may be recessed downward, and the upper surface recessed on the cross-section may have a round shape. The reliability of the via 131 may be further improved through such an anchor-shaped structure.

The upper surface of the first wiring layer 121 may be recessed downward from the upper surface of the first insulating layer 111. For example, the upper surface of the first wiring layer 121 may have a step difference from the upper surface of the first insulating layer 111. This recessed space can be filled with the third insulating layer 113. The plating thickness deviation may be effectively controlled through this substantially constant step difference, and the occurrence of dimples may be effectively prevented.

The side surface of the first wiring layer 121 may be substantially vertical. As can be seen from the process described later, the patterned opening formed by removing the dry film and the first wiring layer 121 formed by filling the patterned opening with plating may have substantially vertical sides. In this case, the spacing between the patterns in the first wiring layer 121 may be more uniform according to the design value. Accordingly, a fine pattern can be formed more effectively. Also, the occurrence of a short between fine patterns can be controlled more effectively.

Hereinafter, components of the printed circuit board 100A according to an embodiment are explained in more detail with reference to the figures.

The first to third insulating layers 111, 112, and 113 may include the non-photosensitive insulating material, respectively. The non-photosensitive insulating materials may be thermosetting resins such as epoxy resins, insulating resins such as thermoplastics such as polyimide, or materials in which these resins are mixed with inorganic fillers such as silica, or resins impregnated with a deep material such as glass fiber (Glass Fiber, Glass Cloth, Glass Fabric) with the inorganic fillers, for example, Ajinomoto Build-up Film (ABF), Prepreg, etc., may be used, but the present disclosure is not limited to thereto. The first to third insulating layers 111, 112, and 113 may include the same type of material, and even in this case, boundaries may be distinguished from each other during the stacked process.

The first wiring layer 121 may include a metal material. For example, the first wiring layer 121 may include the first and second metal layers M1 and M2. The first and second metal layers M1 and M2 may include copper (Cu), respectively. More specifically, the first metal layer M1 may include electrolytic copper, and the second metal layer M2 may include the chemical copper. However, the present disclosure is not limited to thereto, and the first and second metal layers M1 and M2 may include other metal materials such as aluminum (Al), silver (Ag), titanium (Ti), etc. in addition to copper (Cu). The first wiring layer 121 may perform various functions according to the design of the corresponding layer. For example, a ground pattern, a power pattern, and a signal pattern, etc. may be included. Here, the signal pattern can include various signals excluding the ground pattern, the power patterns, etc., such as data signals. Each of these patterns may include a trace, a plane, and/or a pad. The trace may be a fine pattern with a line/space of 2 μm/2 μm or less.

The second wiring layer 122 may include a metal material. For example, the second wiring layer 122 may include copper (Cu). For example, the second wiring layer 122 may include electric motors. However, the present disclosure is not limited to thereto, and in addition to copper (Cu), other metal materials such as aluminum (Al), silver (Ag), titanium (Ti), and the like may be included. The second wiring layer 122 can perform various functions according to the design of the corresponding layer. For example, a ground pattern, a power pattern, a signal pattern, etc. may be included. Here, the signal pattern can include various signals excluding the ground pattern, the power patterns, etc., such as data signals. Each of these patterns may include a trace, plane, and/or pad. The trace may be a fine pattern with a line/space of 2 μm/2 μm or less.

The via hole V can penetrate the second insulating layer 112. Here, a penetration may mean the penetration to the pad. The via hole V may have a diameter at the uppermost side greater than a diameter at the lowermost side. For example, the via hole V may have a tapered shape on a cross section. For example, the via 131 may include first and second metal layers M1 and M2. The via 131 can fill the via hole V1. The via 131 can perform various functions according to a development design. For example, a via for signal connection, a via for ground connection, and a via for power connection, etc. may be included. The number of vias 131 is not particularly limited, and may be a plurality.

Figure 4:
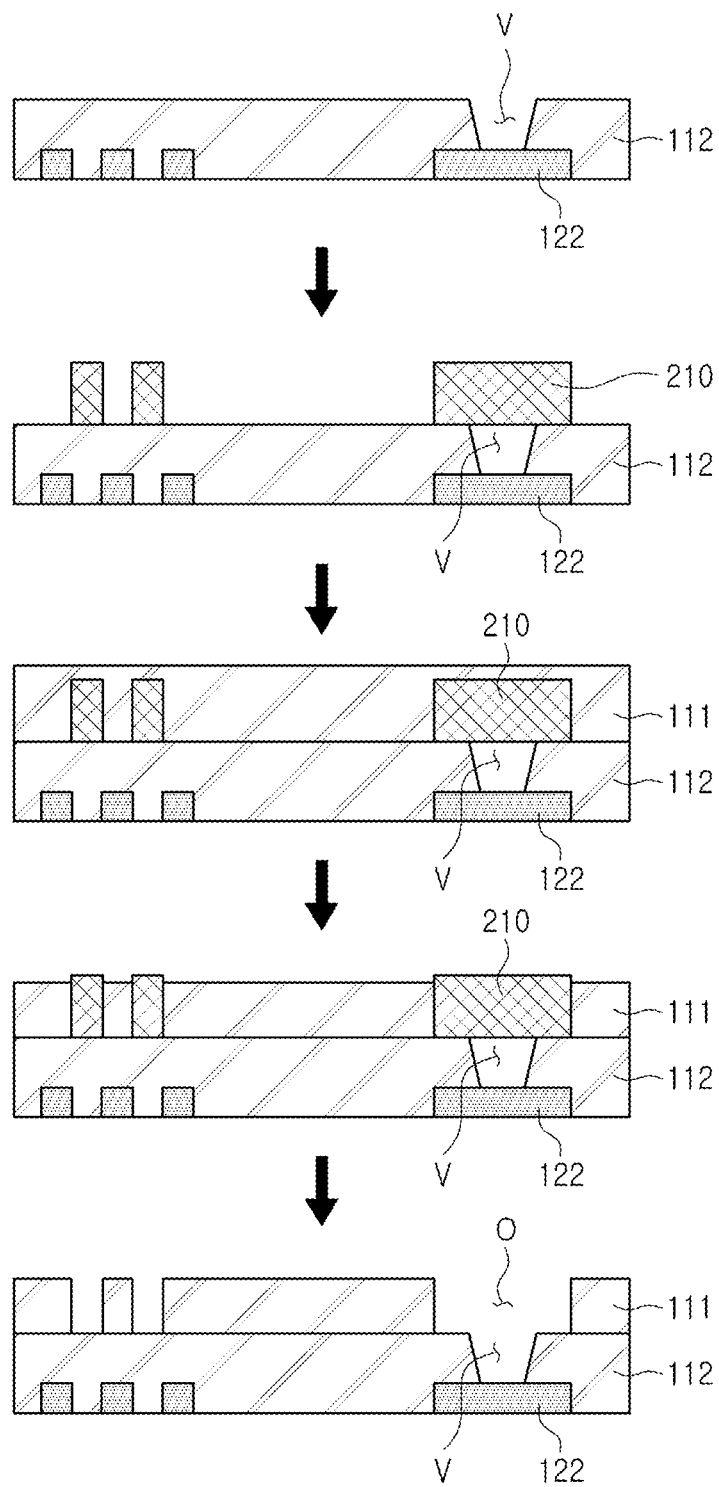
FIGS. 4 and 5 are flow charts schematically illustrating an embodiment of manufacturing the printed circuit board in FIG. 3.
Figure 5:
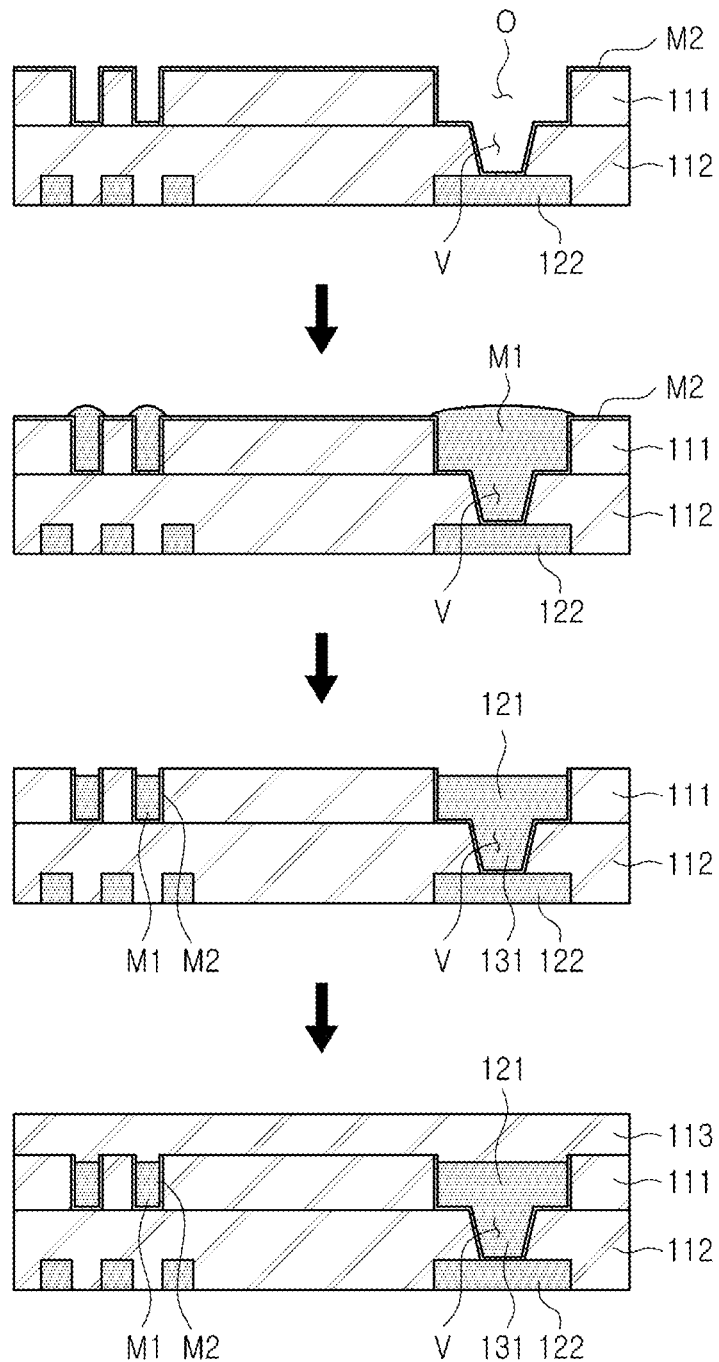

FIGS. 4 and 5 are process views schematically illustrating an embodiment of manufacturing the printed circuit board in FIG. 3.

First, the via hole V is formed in the second insulating layer 112 in which the second wiring layer 122 is embedded in the lower side. The second insulating layer 112 may include a non-photosensitive insulating material, and the via hole V may be formed by laser processing. When desmearing and soft etching are performed after the laser processing, at least a portion of the upper surface of the second wiring layer 122 exposed through the via hole V may be recessed downward. Next, the dry film 210 is formed on the upper surface of the second insulating layer 112 and then exposed and developed to be patterned. The dry film 210 can be formed by stacking a photosensitive film and then drying the same. The patterned dry film 210 may have various patterns for traces, planes, pads, etc.

Next, the first insulating layer 111 for embedding the patterned dry film 210 is formed on the upper surface of the second insulating layer 112. The first insulating layer 111 may be formed by stacking a film-type non-photosensitive insulating material and then drying the same.

Next, the thickness of the first insulating layer 111 is reduced so that the patterned dry film 210 is exposed. For example, a thinning process can cause the thickness of the first insulating layer 111 to be thinner than the thickness of the patterned dry film 210. Furthermore, unlike in the figure, the thickness of the first insulating layer 111 may be substantially the same as the thickness of the patterned dry film 210 by a Chemical Mechanical Coating (CMP) process. Meanwhile, after the tinning or CMP process, roughness may be formed on the upper surface of the first insulating layer 111, thereby improving adhesion to the second metal layer M2, the third insulating layer 113, etc.

Next, the patterned dry film 210 is peeled off by a wet process using a stripper composition. When the patterned dry film 210 is peeled off, a patterned opening O may be formed. The patterned opening O may include a variety of patterns.

Next, with chemical copper plating, a second metal layer M2 is formed on the upper surface of the first insulating layer 111, the wall and bottom surface of the patterned opening O, the wall surface of the via hole V, and the upper surface of the second wiring layer 122 exposed through the via hole V. Like this, since a second metal layer M2, which is the seed layer, is formed after forming the first insulating layer 111, a seed wet etching process that reduces undercut or circuit line width may be omitted.

Next, the first metal layer M1 filling the opening O patterned by electrolytic copper plating and the via hole V is formed. The first metal layer M1 may have a thickness equal to or greater than that of the first insulating layer 111, and thus may protrude from the upper surface of the first insulating layer 111.

Next, the first and second metal layers M1 and M2 on the upper surface of the first insulating layer 111 are removed by flash etching. As a result, the first wiring layer 121 may be formed, and the upper surface of the first wiring layer 121 may be recessed downward from the upper surface of the first insulating layer 111. For example, the upper surface of the first wiring layer 121 may have a step difference from the upper surface of the first insulating layer 111. The upper surface of the first metal layer M1 may be substantially flat. Accordingly, the plating thickness deviation is reduced, and dimples may be prevented.

Next, a third insulating layer 113 covering the exposed upper surface of the first wiring layer 121 is formed on the upper surface of the first insulating layer 111. The third insulating layer 113 can be formed by stacking a film-type non-photosensitive insulating material and then drying the same.

The printed circuit board 100A according to the above described example may be manufactured through a series of processes; other details are substantially the same as described above, and thus a detailed description thereof is omitted.

Figure 6:
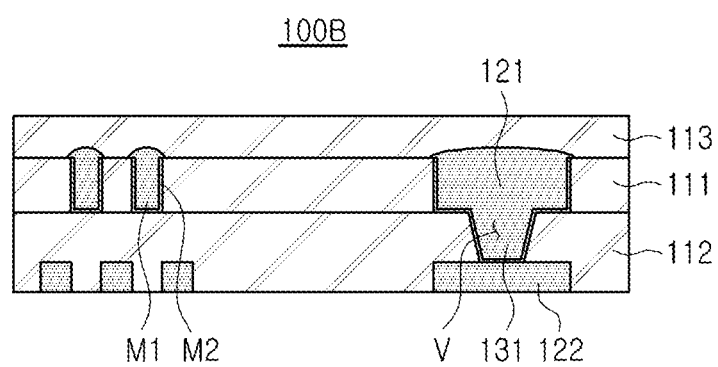
FIG. 6 is a cross-sectional view schematically illustrating another embodiment of a printed circuit board.

FIG. 6 is a cross-sectional view schematically illustrating another embodiment of a printed circuit board.

Referring to the figure, the printed circuit board 100B according to another embodiment, compared to the printed circuit board 100A according to the above-described embodiment, at least a part of the upper surface of the first wiring layer 121 is convex upward from the upper surface of the first insulating layer 111, and the first wiring layer 121 may cover at least a part of the upper surface of the first insulating layer 111. In this case, dimples may be prevented more effectively, and the reliability of the first wiring layer 121 may be further enhanced. Other than that, the other details are substantially the same as described above, and a detailed description thereof is omitted.

Figure 7:
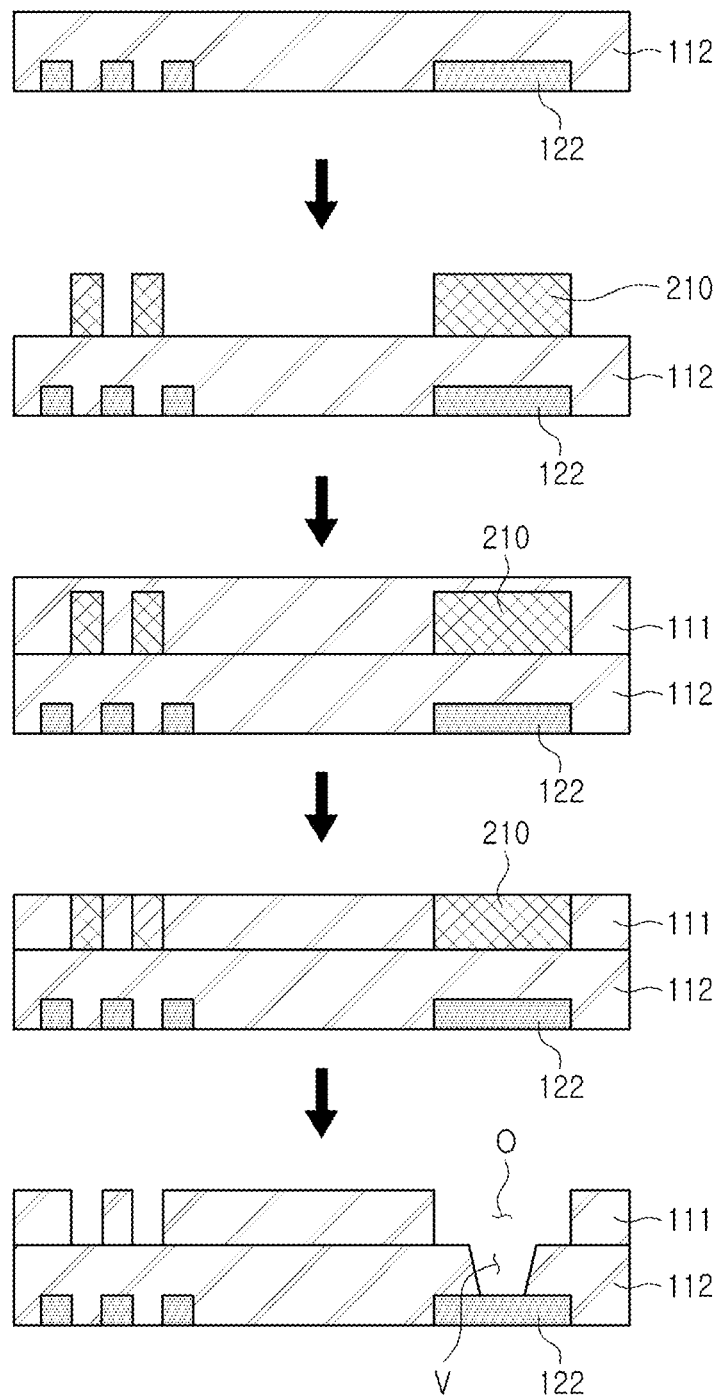
FIGS. 7 and 8 are process views schematically illustrating an embodiment of manufacturing the printed circuit board in FIG. 6.
Figure 8:
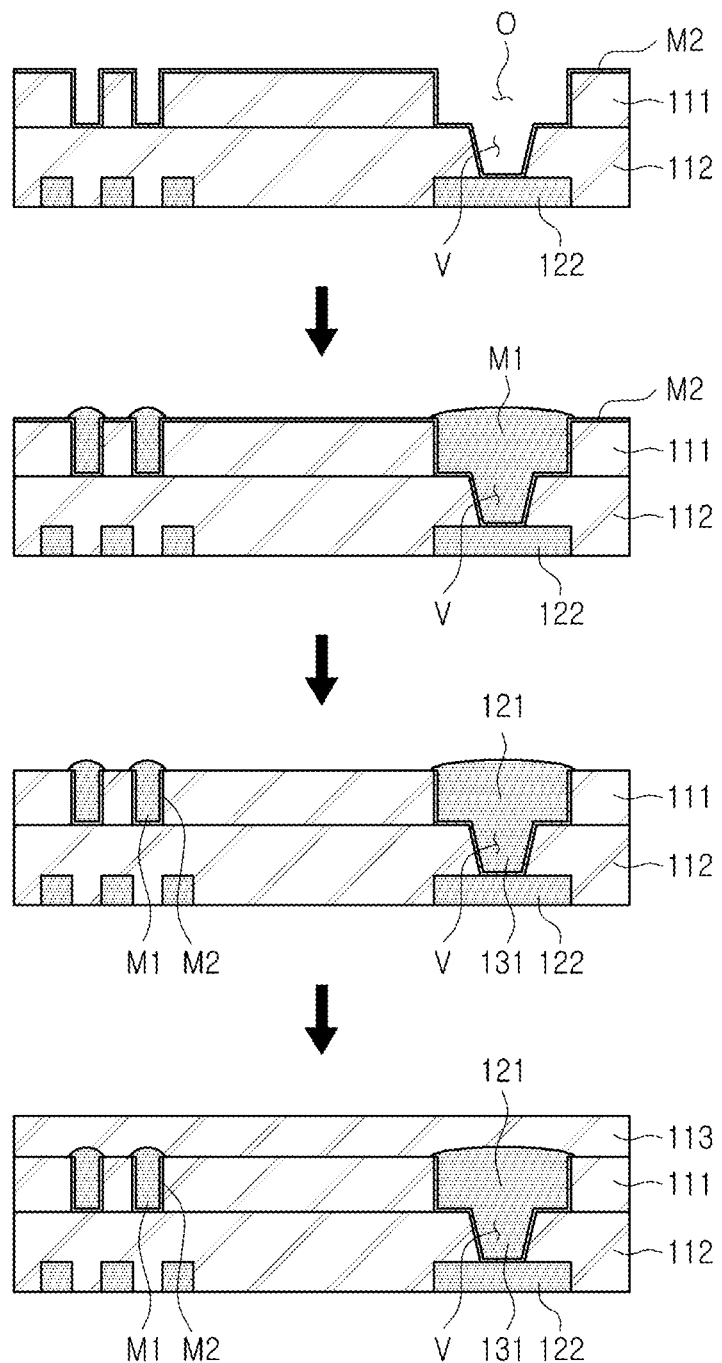

FIGS. 7 and 8 are flow charts schematically illustrating an embodiment of manufacturing the printed circuit board in FIG. 6.

First, the second insulating layer 112 in which the second wiring layer 122 is embedded in the lower side is prepared.

Next, the dry film 210 is formed on the upper surface of the second insulating layer 112 and then exposed and developed to be patterned. The dry film 210 can be formed by stacking a photosensitive film and then drying the same. The patterned dry film 210 may have various patterns for traces, planes, pads, etc.

Next, the first insulating layer 111 for embedding the patterned dry film 210 is formed on the upper surface of the second insulating layer 112. The first insulating layer 111 may be formed by stacking a film-type non-photosensitive insulating material and then drying the same.

Next, the thickness of the first insulating layer 111 is reduced so that the patterned dry film 210 is exposed. For example, the thickness of the first insulating layer 111 may be substantially the same as the thickness of the patterned dry film 210 by the CMP (Chemical Mechanical Coating) process. Meanwhile, after the tinning or CMP process, the roughness may be formed on the upper surface of the first insulating layer 111, thereby improving the adhesion to the second metal layer M2, the third insulating layer 113, etc.

Next, the patterned dry film 210 is peeled off by the wet process using the stripper composition. When the patterned dry film 210 is peeled off, the patterned opening O may be formed. The patterned opening O may include the variety of patterns. After peeling off the patterned dry film, the via hole V is formed in the second insulating layer 112. The second insulating layer 112 may include the non-photosensitive insulating material, and the via hole V may be formed by the laser processing. When the desmearing and the soft etching are performed after the laser processing, at least a portion of the upper surface of the second wiring layer 122 exposed through the via hole V may be recessed downward.

Next, with the chemical copper plating, the second metal layer M2 is formed on the upper surface of the first insulating layer 111, the wall and bottom surface of the patterned opening O, the wall surface of the via hole V, and the upper surface of the second wiring layer 122 exposed through the via hole V. Like this, since the second metal layer M2, which is the seed layer, is formed after forming the first insulating layer 111, the seed wet etching process that reduces the undercut or the circuit line width may be omitted.

Next, the first metal layer M1 filling the opening O patterned by the electrolytic copper plating and the via hole V is formed. The first metal layer M1 may have the thickness equal to or greater than that of the first insulating layer 111, and thus may protrude from the upper surface of the first insulating layer 111.

Next, the first and second metal layers M1 and M2 on the upper surface of the first insulating layer 111 are removed by the flash etching. As a result, the first wiring layer 121 may be formed, and as described above, since the first metal layer M1 is formed to be thick, at least a part of the upper surface of the first wiring layer 121 after flash etching may be convex upward from the upper surface of the first insulating layer 111. In addition, the first wiring layer 121 may cover at least a portion of the upper surface of the first insulating layer 111. Accordingly, the dimple may be more reliably prevented, and reliability of the first wiring layer 121 may be further improved.

Next, the third insulating layer 113 covering the exposed upper surface of the first wiring layer 121 is formed on the upper surface of the first insulating layer 111. The third insulating layer 113 can be formed by stacking the film-type non-photosensitive insulating material and then drying the same.

The printed circuit board 100B according to the above described example may be manufactured through a series of processes; other details are substantially the same as described above, and thus a detailed description thereof is omitted.

Figure 9:
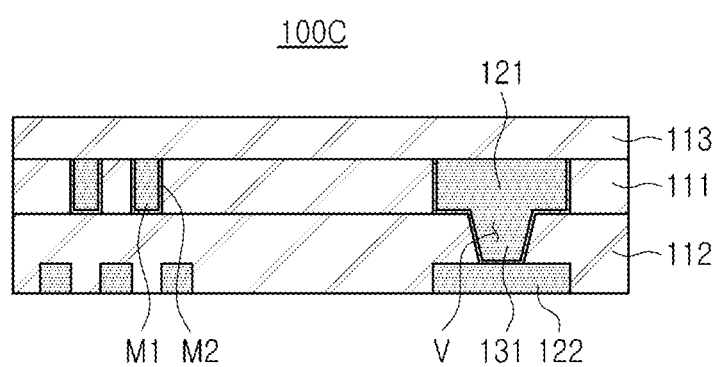
FIG. 9 is a cross-sectional view showing another embodiment of a printed circuit board.

FIG. 9 is a cross-sectional view showing another example of a printed circuit board.

Referring to the figure, in the printed circuit board 100C according to another example, compared to the printed circuit board 100A according to the example described above, the upper surface of the first wiring layer 121 is substantially co-planar with the upper surface of the first insulating layer 111. In this case, plating thickness variations can be reduced more effectively. Also, by forming a surface finish on the upper surface of the first insulating layer 111, adhesion with the third insulating layer 113 can be further improved. Other than that, the other details are substantially the same as described above, and detailed explanation of this is omitted.

Figure 10:
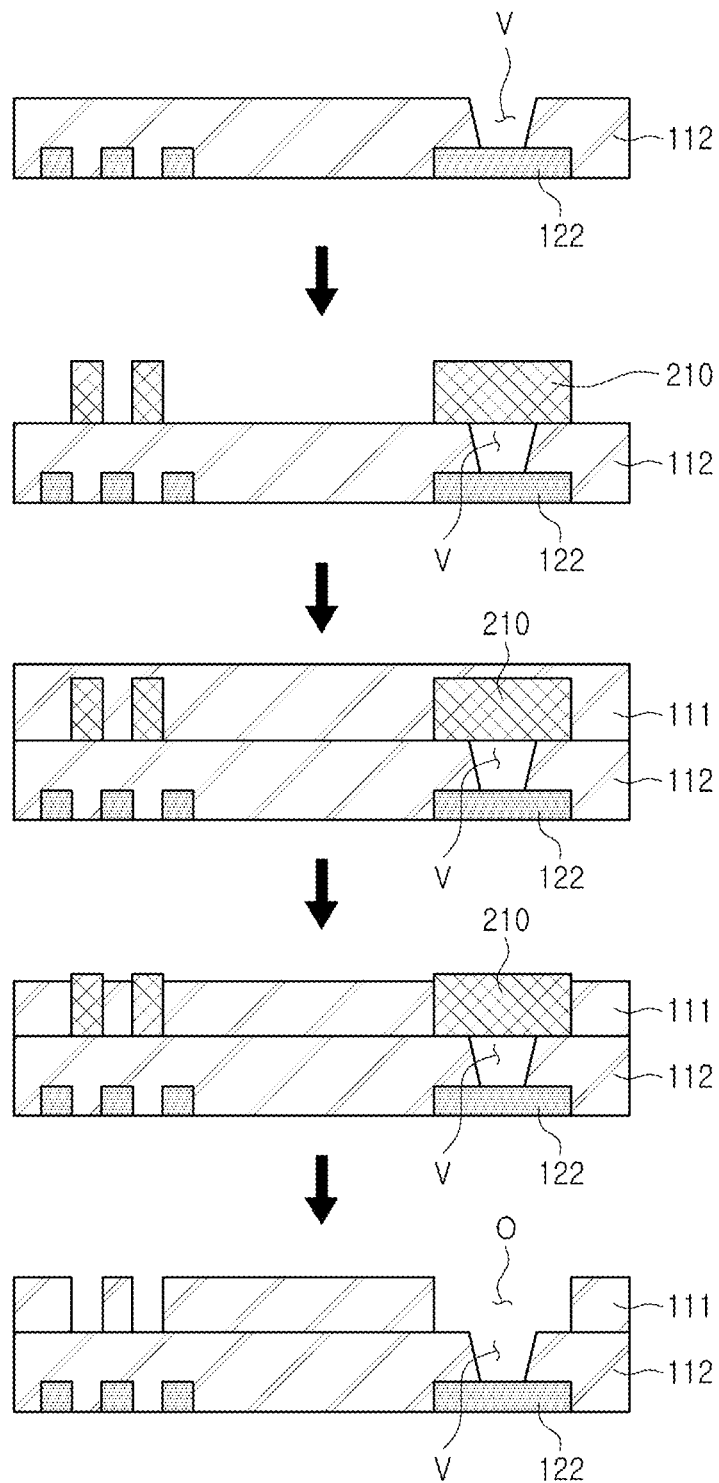
FIGS. 10 and 11 are process views schematically illustrating an embodiment of manufacturing the printed circuit board in FIG. 9.
Figure 11:
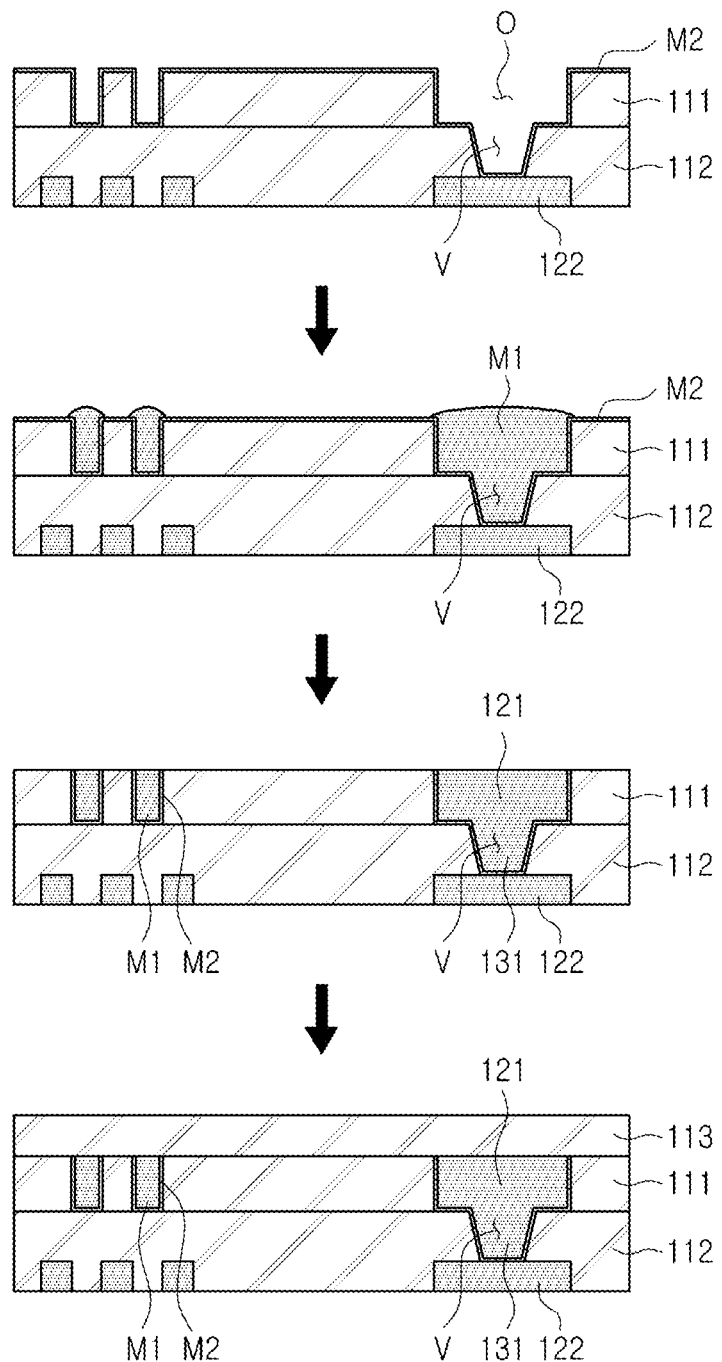

FIG. 10 and FIG. 11 are process views that outline an example of manufacturing a printed circuit board in FIG. 9.

First, the via hole V is formed in the second insulating layer 112 in which the second wiring layer 122 is embedded in the lower side. The second insulating layer 112 may include the non-photosensitive insulating material, and the via hole V may be formed by the laser processing. When the desmearing and the soft etching are performed after the laser processing, at least a portion of the upper surface of the second wiring layer 122 exposed through the via hole V may be recessed downwardly.

Next, the dry film 210 is formed on the upper surface of the second insulating layer 112 and then exposed and developed to be patterned. The dry film 210 can be formed by stacking the photosensitive film and then drying the same. The patterned dry film 210 may have the various patterns for traces, planes, pads, etc.

Next, the first insulating layer 111 for embedding the patterned dry film 210 is formed on the upper surface of the second insulating layer 112. The first insulating layer 111 may be formed by stacking the film-type non-photosensitive insulating material and then drying the same.

Next, the thickness of the first insulating layer 111 is reduced so that the patterned dry film 210 is exposed. For example, the thinning process can cause the thickness of the first insulating layer 111 to be thinner than the thickness of the patterned dry film 210. Meanwhile, after the tinning or CMP process, the roughness may be formed on the upper surface of the first insulating layer 111, thereby improving the adhesion to the second metal layer M2, the third insulating layer 113, etc.

Next, the patterned dry film 210 is peeled off by the wet process using the stripper composition. When the patterned dry film 210 is peeled off, the patterned opening O may be formed. The patterned opening O may include the variety of patterns.

Next, with the chemical copper plating, the second metal layer M2 is formed on the upper surface of the first insulating layer 111, the wall and bottom surface of the patterned opening O, the wall surface of the via hole V, and the upper surface of the second wiring layer 122 exposed through the via hole V. Like this, since the second metal layer M2, which is the seed layer, is formed after forming the first insulating layer 111, the seed wet etching process that reduces undercut or circuit line width may be omitted.

Next, the first metal layer M1 filling the opening O patterned by the electrolytic copper plating and the via hole V is formed. The first metal layer M1 may have the thickness equal to or greater than that of the first insulating layer 111, and thus may protrude from the upper surface of the first insulating layer 111.

Next, the first and second metal layers M1 and M2 on the upper surface of the first insulating layer 111 are removed by the CMP process. As a result, the first wiring layer 121 may be formed, and the upper surface of the first wiring layer 121 may be substantially coplanar with the upper surface of the first insulating layer 111. In this case, the plating thickness deviation may be more effectively reduced. In addition, by forming a surface roughness on the upper surface of the first insulating layer 111, adhesion with the third insulating layer 113 may be further improved.

Next, the third insulating layer 113 covering the exposed upper surface of the first wiring layer 121 is formed on the upper surface of the first insulating layer 111. The third insulating layer 113 can be formed by stacking the film-type non-photosensitive insulating material and then drying the same.

The printed circuit board 100A according to the above described embodiment may be manufactured through a series of processes; other details are substantially the same as described above, and thus a detailed description thereof will be omitted.

Figure 12:
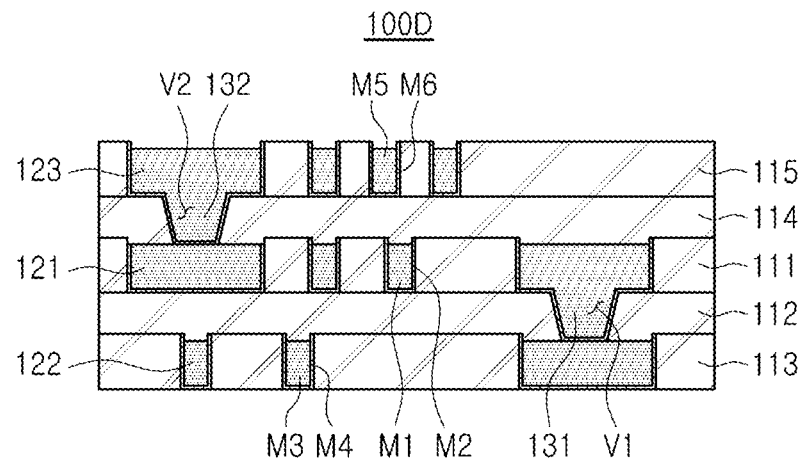
FIG. 12 is a cross-sectional view showing another embodiment of a printed circuit board.

FIG. 12 is a cross-sectional view showing another embodiment of a printed circuit board.

Referring to the figure, the printed circuit board 100D according to another an embodiment is the first insulating layer 111, the first wiring layer 121 embedded in the first insulating layer 111, where the upper surface thereof is exposed from the upper surface of the first insulating layer 111, the second insulating layer 112 disposed on the lower surface of the first insulating layer 111 to cover the at least a portion of the lower surface of the first wiring layer 121, a third insulating layer 113 disposed on the lower surface of the second insulating layer 112, a second wiring layer 122 embedded in the third insulating layer 113 where the upper surface thereof is exposed from the upper surface of the third insulating layer 113, a first via 131 disposed in the first via hole V penetrating the second insulating layer 112 to electrically connect the first and second wiring layers 121 and 122, a fourth insulating layer 114 disposed on the upper surface of the first insulating layer 111 to cover at least a portion of the exposed upper surface of the first wiring layer 121, a fourth insulating layer 115 disposed on the upper surface of the fourth insulating layer 114, a third wiring layer 123 embedded in the fifth insulating layer 115 where the upper surface thereof is exposed from the upper surface of the fifth insulating layer 115, and a second via 132 disposed in the second via hole V2 penetrating the fourth insulating layer 114 to electrically connect the first and third wiring layers 121 and 123.

The first wiring layer 121 may include the first metal layer M1 and the second metal layer M2 covering at least a portion of each of the lower surface and side surface of the first metal layer M1 with the thinner thickness than the first metal layer M1. The second metal layer M2 may be the seed layer for the formation of the first metal layer M1. The first via 131 may include the wall surface of the first via hole V1, the second metal layer M2 extending onto the upper surface exposed through the first via hole V1 of the second wiring layer 122, and the first metal layer M1 extending into the first via hole V1. This arrangement of the second metal layer M2 may omit the flash etching process to remove the seed layer, thereby effectively suppressing the undercutting in the first wiring layer 121 and reducing the line width of the first wiring layer 121.

The second wiring layer 122 may include the third metal layer M3 and the fourth metal layer M4 covering at least a portion of each of the lower surface and side surface of the third metal layer M3 with the thinner thickness than the third metal layer M1. The fourth metal layer M4 may be the seed layer for the formation of the third metal layer M3. This arrangement of the fourth metal layer M4 may omit the flash etching process to remove the seed layer, thereby effectively suppressing the undercutting in the second wiring layer 122 and reducing the line width of the second wiring layer 121.

The third wiring layer 123 may include the fourth metal layer M and the sixth metal layer M6 covering at least a portion of each of the lower surface and side surface of the fourth metal layer M5 with the thinner thickness than the fourth metal layer M5. The sixth metal layer M6 may be the seed layer for the formation of the fourth metal layer M5. The second via 132 may include the wall surface of the second via hole V2, the second metal layer M2 extending onto the upper surface of the first wiring layer 122 exposed through the second via hole V2 of the second wiring layer 122, and the first metal layer M1 extended into the second via hole V2, and this arrangement of the sixth metal layer M6 may omit the flash etching process to remove the seed layer, thereby effectively suppressing the undercutting in the third wiring layer 123 and reducing the line width of the third wiring layer 123.

The first insulating layer 111, the second insulating layer 112, the third insulating layer 113, the fourth insulating layer 114, and/or the fifth insulating layer 115 may include the non-photosensitive insulating material, respectively. For example, the Ajinomoto Build-up Film (ABF) may be included. In particular, when the first insulating layer 111, the third insulating layer 113, and the fifth insulating layer 115 include the non-photosensitive insulating material, patterned openings for forming the first wiring layer 121, the second wiring layer 122, and the third wiring layer 123 may be formed using the patterned dry film, thereby forming the wiring layers 121, 122, and 123 by plating after forming the insulating layers 111, 113, and 115, and the mechanism for undercutting the wiring layers 121, 122, and 123 may be removed from the beginning. Also, when the second insulating layer 112 and the fourth insulating layer 114 include the non-photosensitive insulating material, the first via hole V1 and the second via hole v2 are formed by the laser processing, etc., and a part of the upper surface of each of the second wiring layer 122 and the first wiring layer 121 exposed through the first via hole V1 and the second via hole V2, respectively, may be recessed downward, and the upper surface recessed on the cross-section may have a rounded shape. The reliability of the first via 131 and the second via 132 may be further improved through such an anchor-shaped structure.

The upper surface of each of the first wiring layer 121, the second wiring layer 122, and the third wiring layer 123 may be recessed downward from the upper surface of each of the first insulating layer 111, the third insulating layer 113, and the fifth insulating layer 115. For example, the upper surface of each of the first wiring layer 121, the second wiring layer 122, and the third wiring layer 123 may have a step difference from the upper surface of each of the first insulating layer 111, the third insulating layer 113, and the fifth insulating layer 115. The recessed spaces formed on the upper surface of each of the second wiring layer 122 and the first wiring layer 121 may be filled with the second insulating layer 112 and the fourth insulating layer 114, respectively. The plating thickness deviation may be effectively controlled through this substantially constant step difference, and the occurrence of dimples may be effectively prevented.

The side surface of each of the first wiring layer 121, the second wiring layer 122, and the third wiring layer 123 may be substantially vertical. For example, the patterned opening formed by removing the dry film and the first wiring layer 121, the second wiring layer 122, and the third wiring layer 123 formed by filling it with plating may have substantially vertical sides. In this case, the spacing between the patterns in each of the first wiring layer 121, the second wiring layer 122, and the third wiring layer 123 may be more uniform according to the design value. Accordingly, the fine pattern can be formed more effectively. Also, the occurrence of the short between fine patterns can be controlled more effectively.

Hereinafter, components of the printed circuit board 100D according to an embodiment are explained in more detail with reference to the figures.

The first to fourth insulating layers 111, 112, 113, 114, and 115 may include the non-photosensitive insulating material, respectively. The non-photosensitive insulating materials may be thermosetting resins such as epoxy resins, insulating resins such as thermoplastics such as polyimide, or materials in which these resins are mixed with inorganic fillers such as silica, or resins impregnated with a deep material such as glass fiber (Glass Fiber, Glass Cloth, Glass Fabric) with the inorganic fillers, for example, ABF, Prepreg, etc., may be used, but the present disclosure is not limited to thereto. The first to fourth insulating layers 111, 112, 113, 114, and 115 may include the same type of material, and even in this case, boundaries may be distinguished from each other during the stacked process.

The first to third wiring layers 121, 122, and 123 may include a metal material, respectively. For example, the first wiring layer 121 may include the first and second metal layers M1 and M2. The second wiring layer 122 may include the third and fourth metal layers M3 and M4. The third wiring layer 123 may include the fourth and sixth metal layers M5 and M6. The first to sixth metal layers M1, M2, M3, M4, M5, and M6 may include copper (Cu), respectively. More specifically, the first, third, fourth metal layers M1, M3, and M5 may include the electrolytic copper, respectively, and the second, fourth, sixth metal layers M2, M4, and M6 may include the chemical copper, respectively. However, the present disclosure is not limited to thereto, and the first and sixth metal layers M1, M2, M3, M4, M5, and M6 may include other metal materials such as aluminum (Al), silver (Ag), titanium (Ti), etc. in addition to copper (Cu), respectively. The first to third wiring layers 121, 122, and 123 may perform the various functions according to the design of the corresponding layer, respectively. For example, the ground pattern, the power pattern, and the signal pattern, etc. may be included. Here, the signal pattern can include the various signals excluding the ground pattern, the power patterns, etc., such as the data signals. Each of these patterns may include the trace, the plane, and/or the pad. The trace may be the fine pattern with the line/space of 2 μm/2 μm or less.

The first via hole V1 and the second via hole V2 can penetrate the second insulating layers 112 and the fourth insulating layer 114, respectively. Here, a penetration may mean the penetration to the pad. The first via hole V1 and the second via hole V2 may have a diameter at the uppermost side greater than a diameter at the lowermost side, respectively. For example, the first via hole V1 and the second via hole V2 may have a tapered shape on a cross section, respectively. The first via hole V1 and the second via hole V2 may include the metal material, respectively. For example, the first via 131 may include the first and second metal layers M1 and M2. The second via 132 may include the fourth and sixth metal layers M5 and M6. The first via 131 and the second via 132 can fill the first via hole V1 and the second via hole V2, respectively. The first via 131 and the second via 132 can perform the various functions according to the development design, respectively. For example, the via for signal connection, the via for ground connection, and the via for power connection, etc. may be included. The number of the first via 131 and the second via 132 is not particularly limited, and may be a plurality.

Meanwhile, an embodiment of manufacturing the printed circuit board 100D according to another example may be based on the description of the manufacturing embodiment of the printed circuit board 100A according to the aforementioned embodiment, and a detailed description thereof will be omitted.

Figure 13:
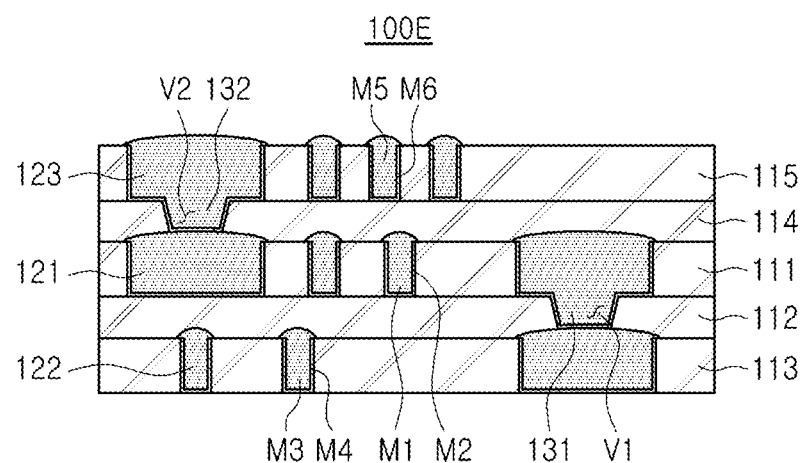
FIG. 13 is a cross-sectional view showing another embodiment of a printed circuit board.

FIG. 13 is a cross-sectional view showing another embodiment of a printed circuit board.

Referring to the figure, the printed circuit board 100E according to another embodiment, compared to the printed circuit board 100D according to another embodiment as described above, at least a part of the upper surface of each of the first to third wiring layers 121, 122, and 123 is convex upward from the upper surface of each of the first, third, and fifth insulating layer 111, 113, and 115, and each of the first to third wiring layers 121, 122, and 123 may cover at least a part of the upper surface of each of the first, third, and fifth insulating layer 111, 113, and 115. In this case, the dimples may be prevented more effectively, and the reliability of the first wiring layer 121 may be further enhanced. Other than that, the other details are substantially the same as described above, and a detailed description thereof is omitted.

Meanwhile, an embodiment of manufacturing the printed circuit board 100E according to another example may be based on the description of the manufacturing embodiment of the printed circuit board 100B according to the aforementioned embodiment, and a detailed description thereof will be omitted.

Figure 14:
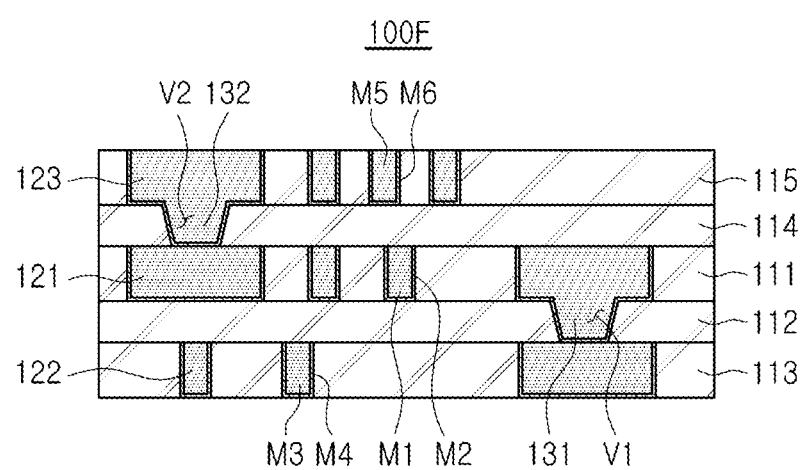
FIG. 14 is a cross-sectional view showing another embodiment of a printed circuit board.

FIG. 14 is a cross-sectional view showing another embodiment of a printed circuit board.

Referring to the figure, in the printed circuit board 100F according to another example, compared to the printed circuit board 100D according to the example described above, the upper surface of each of the first to third wiring layers 121, 122, and 123 is substantially co-planar with the upper surface of each of the first, third, and fifth insulating layers 111, 113, and 115. In this case, the plating thickness variations can be reduced more effectively. Also, by forming a surface finish on the upper surface of each of the first, third, and fourth insulating layers 111, 113, and 115, the adhesion with the second and fourth insulating layers 112 and 114 can be further improved. Other than that, the other details are substantially the same as described above, and detailed explanation of this is omitted.

Meanwhile, an embodiment of manufacturing the printed circuit board 100F according to another example may be based on the description of the manufacturing embodiment of the printed circuit board 100C according to the aforementioned embodiment, and a detailed description thereof will be omitted.

On the other hand, the printed circuit boards described above 100A, 100B, 100C, 100D, 100E, and 100F can be used in a package substrate, an interposer substrate, or a bridge substrate including microcircuits for multi-die interconnection, and the present disclosure is not limited thereto.

In the present disclosure, the meaning of "substantially" may be determined by including a process error, a position deviation, an error at the time of measurement, and the like occurring in the process. For example, "substantially flat" may include not only the case of complete flatness, but also the case where there are minute differences approximately caused by process errors. In addition, "substantially coplanar" may include not only the case of complete coplanar, but also the case of the presence of minute differences approximately caused by process errors. Furthermore, "substantially vertical" may include not only the case where it is completely vertical, but also the case of the presence of minute differences approximately caused by process errors.

In the present disclosure, the meaning of "is connected" is a concept including not only directly connected but also indirectly connected. In addition, the expressions such as first and second are used to distinguish one component from another, and do not limit the order and/or importance of the components. In some cases, without departing from the scope of rights, the first component may be referred to as the second component, or similarly, the second component may be referred to as the first component.

The expression 'an embodiment' used in this description does not refer to the same embodiments, and is provided to emphasize and describe each different unique feature. However, the embodiments presented above do not exclude being implemented in combination with features of other embodiments. For example, even if a point described in an embodiment is not described in another embodiment, it may be understood as a description related to another embodiment, unless there is a description that is contrary or contradictory to the point in another embodiment.

The terms used in the present disclosure are used only to describe an embodiment and are not intended to limit the present disclosure. In this case, the singular expression includes the plural expression unless it is clearly meant differently in the context.

What is claimed is:

1. A printed circuit board, comprising:
   a first insulating layer including a non-photosensitive insulating material;
   a first wiring layer embedded in the first insulating layer, where an upper surface thereof is exposed from an upper surface of the first insulating layer, and which includes a first metal layer and a second metal layer covering at least a portion of each of lower surface and side surface of the first metal layer with a thickness thinner than the first metal layer; and
   a second insulating layer disposed under the lower surface of the first insulating layer, covering at least a portion of a lower surface of the first wiring layer, and including the non-photosensitive insulating material,
   wherein boundaries of the first and second insulating layers are separated from each other.

2. The printed circuit board of claim 1, wherein the first and second insulating layers include an Ajinomoto Build-Up Film (ABF), respectively.

3. The printed circuit board of claim 1, further comprising:
   a second wiring layer embedded in a lower side of the second insulating layer in a direction on which the first insulating layer and the second insulating layer are disposed; and
   a via which is disposed in a via hole penetrating the second insulating layer to electrically connect the first and second wiring layers, and includes a wall surface of the via hole and the second metal layer extending above an upper surface exposed of the second wiring layer through the via hole, and the first metal layer extending into the via hole.

4. The printed circuit board of claim 3, further comprising:
   a third insulating layer disposed on the upper surface of the first insulating layer to cover at least a portion of the exposed upper surface of the first wiring layer, and including the non-photosensitive insulating material.

5. The printed circuit board of claim 1, further comprising:
   the third insulating layer disposed on the lower surface of the second insulating layer, and including the non-photosensitive insulating material;
   a second wiring layer embedded in the third insulating layer, where an upper surface thereof is exposed from an upper surface of the third insulating layer, and which includes a third metal layer and a fourth metal layer covering at least a portion of each of lower surface and side surface of the third metal layer with a thickness thinner than the third metal layer; and
   a first via which is disposed in a first via hole penetrating the second insulating layer to electrically connect the first and second wiring layers, and includes a wall surface of the first via hole and the first metal layer extending above the upper surface exposed of the second wiring layer through the first via hole, and the second metal layer extending into the first via hole.

6. The printed circuit board of claim 5, further comprising:
   a fourth insulating layer disposed on the upper surface of the first insulating layer to cover at least a portion of the exposed upper surface of the first wiring layer, and including the non-photosensitive insulating material;
   a fifth insulating layer disposed on an upper surface of the fourth insulating layer, and including the non-photosensitive insulating material;

a third wiring layer embedded in the fifth insulating layer, where an upper surface thereof is exposed from an upper surface of the fifth insulating layer, and includes a fifth metal layer, and which includes a sixth metal layer covering at least a portion of each of lower surface and side surface of the fifth metal layer with a thickness thinner than the fifth metal layer; and a second via which is disposed in a second via hole penetrating the fourth insulating layer to electrically connect the first and third wiring layers, and includes a wall surface of the second via hole and the fifth metal layer extending above the upper surface exposed of the first wiring layer through the second via hole, and the sixth metal layer extending into the second via hole.

7. The printed circuit board of claim 1, wherein the upper surface of the first wiring layer is substantially coplanar with the upper surface of the first insulating layer.

8. A printed circuit board, comprising:
a first insulating layer including a non-photosensitive insulating material;
a first wiring layer embedded in the first insulating layer, where an upper surface thereof is exposed from an upper surface of the first insulating layer, and which includes a first metal layer and a second metal layer covering at least a portion of each of lower surface and side surface of the first metal layer with a thickness thinner than the first metal layer; and
a second insulating layer disposed under the lower surface of the first insulating layer, covering at least a portion of a lower surface of the first wiring layer, and including the non-photosensitive insulating material,
wherein the upper surface of the first wiring layer is recessed downward from the upper surface of the first insulating layer in a direction on which the first insulating layer and the second insulating layer are disposed, and the upper surface of the first wiring layer has a step difference from the upper surface of the first insulating layer.

9. A printed circuit board, comprising:
a first insulating layer including a non-photosensitive insulating material;
a first wiring layer embedded in the first insulating layer, where an upper surface thereof is exposed from an upper surface of the first insulating layer, and which includes a first metal layer and a second metal layer covering at least a portion of each of lower surface and side surface of the first metal layer with a thickness thinner than the first metal layer; and
a second insulating layer disposed under the lower surface of the first insulating layer, covering at least a portion of a lower surface of the first wiring layer, and including the non-photosensitive insulating material, wherein at least a portion of the upper surface of the first wiring layer is convex upward from the upper surface of the first insulating layer.

10. The printed circuit board of claim 9, wherein the first wiring layer covers at least a portion of the upper surface of the first insulating layer.

11. A printed circuit board, comprising:
an insulating layer including a non-photosensitive insulating material;
a first wiring layer embedded in an upper side of the insulating layer, where an upper surface thereof is exposed from the upper surface of the insulating layer, and which includes a first metal layer and a second metal layer covering at least a portion of each of lower surface and side surface of the first metal layer with a thickness thinner than the first metal layer, wherein the first wiring layer has a vertical side surface;
a second wiring layer embedded in a lower side of the insulating layer, in which a lower surface thereof is exposed from the lower surface of the insulating layer; and
a via which is disposed in a via hole penetrating the insulating layer to electrically connect the first and second wiring layers, and includes a wall surface of the via hole and the second metal layer extending above an upper surface exposed of the second wiring layer through the via hole, and the first metal layer extending into the via hole,
wherein the insulating layer includes first and second insulating layers, the first wiring layer is embedded in the first insulating layer where an upper surface thereof is exposed from an upper surface of the first insulating layer, and the second wiring layer is embedded in the second insulating layer and a lower surface thereof is exposed from a lower surface of the second insulating layer,
wherein the insulating layer further includes a third insulating layer disposed between the first and second insulating layers, and the via hole penetrates the third insulating layer, and
wherein boundaries of the first and third insulating layers are separated from each other, and boundaries of the second and third insulating layers are separated from each other.

12. The printed circuit board of claim 11, wherein the first metal layer includes electrolytic copper, and the second metal layer includes chemical copper.

* * * * *